United States Patent
Lotfy et al.

[11] Patent Number: 5,850,351
[45] Date of Patent: Dec. 15, 1998

[54] DISTRIBUTED MANAGEMENT APPARATUS FOR BATTERY PACK

[75] Inventors: Nader Michael Lotfy, Monrovia; Robert Charles Diefenbach, Ontario, both of Calif.; Benjamin Michael Eiref, Princeton, N.J.

[73] Assignee: General Motors Corporation, Detroit, Mich.

[21] Appl. No.: 637,573

[22] Filed: Apr. 25, 1996

[51] Int. Cl.[6] .............................. G08B 21/00; H02J 7/00; H01M 10/46

[52] U.S. Cl. ............................ 364/492; 364/483; 320/17; 320/18; 320/6; 320/13; 320/5; 320/15; 340/636; 395/750

[58] Field of Search ....................... 364/492, 483; 320/2, 5, 14, 15, 17, 18, 21, 30, 35, 48, 6, 13; 340/636, 825.54, 825.57, 870.29; 395/750

[56] References Cited

U.S. PATENT DOCUMENTS

| | | | |
|---|---|---|---|
| 3,623,139 | 11/1971 | Dickerson | 320/22 |
| 3,849,605 | 11/1974 | Russell | 379/9 |
| 4,061,955 | 12/1977 | Thomas et al. | 320/6 |
| 4,079,303 | 3/1978 | Cox | 320/17 |
| 4,172,221 | 10/1979 | Iizuka | 250/214 SW |
| 4,238,721 | 12/1980 | DeLuca et al. | 320/18 |
| 4,281,277 | 7/1981 | Lakey | 320/6 |
| 4,303,877 | 12/1981 | Meinhold | 320/6 |
| 4,456,871 | 6/1984 | Stich | 323/217 |
| 4,467,266 | 8/1984 | Ritchie | 320/40 |
| 4,564,798 | 1/1986 | Young | 320/6 |
| 4,614,905 | 9/1986 | Petersson et al. | 320/18 |
| 4,616,170 | 10/1986 | Urstoger | 320/5 |
| 4,713,597 | 12/1987 | Altmejd | 320/13 |
| 4,743,830 | 5/1988 | Lakey | 320/6 |
| 4,871,956 | 10/1989 | Barella | 320/13 |
| 4,876,495 | 10/1989 | Palanisamy et al. | 320/18 |
| 5,003,244 | 3/1991 | Davis, Jr. | 320/17 |
| 5,063,340 | 11/1991 | Kalenowsky | 320/1 |
| 5,151,644 | 9/1992 | Pearson et al. | 320/14 |
| 5,153,496 | 10/1992 | LaForge | 320/17 |
| 5,177,425 | 1/1993 | Goto | 320/6 |
| 5,202,617 | 4/1993 | Nor | 320/2 |
| 5,206,578 | 4/1993 | Nor | 320/14 |
| 5,270,635 | 12/1993 | Hoffman et al. | 320/21 |
| 5,283,512 | 2/1994 | Stadnick et al. | 320/18 |
| 5,349,535 | 9/1994 | Gupta | 364/483 |
| 5,387,857 | 2/1995 | Honda et al. | 320/18 |
| 5,422,493 | 6/1995 | Kestenbaum et al. | 250/551 |
| 5,422,558 | 6/1995 | Stewart | 320/7 |
| 5,498,950 | 3/1996 | Ouwerkerk | 320/18 |
| 5,504,415 | 4/1996 | Podrazhansky et al. | 320/18 |

*Primary Examiner*—James P. Trammell
*Assistant Examiner*—Tuan Q. Dam
*Attorney, Agent, or Firm*—Robert M. Sigler

[57] ABSTRACT

In a distributed management apparatus for a battery pack, a battery monitoring module for each individual battery comprises a microcomputer and apparatus for bi-directional communication with a central control. Each microcomputer is provided with memory and its own control program, which allow sophisticated data gathering, communication and bypass control functions to be performed by each battery monitoring module independently of the central control, although still at its command, for more efficient control design and more flexible and capable system operation. In a preferred embodiment, each battery monitoring module may further comprise voltage and temperature measuring circuits with inputs to the microcomputer and a bypass circuit incorporating the microcomputer itself. All the battery monitoring modules are linked with an interface module by a minimal element, common digital communication circuit for bi-directional communication between each of the battery monitoring modules and the central control. Each battery monitoring module may provide bypass activation alternatively, as commanded by the central control, in a timer mode, in which the bypass path is activated for a commanded time, or a voltage mode, in which the bypass path is activated when the battery voltage equals a commanded value.

6 Claims, 6 Drawing Sheets

| MSG# | TYPE | DATA SEQUENCE | | | | DIRECTION |
|---|---|---|---|---|---|---|
| 0 | Freeze Data Command | 0 | 0 | 0 | 0 | INT>BUS |
| 1 | Targeted Initialization Query | IDL | IDH | 1 | CK1 | INT>BUS |
|  | Address Response | IDL | IDH | CK2 |  | MON>BUS |
| 2 | General Initialization Query | 0 | 0 | 2 | 2 | INT>BUS |
|  | Address Response | IDL | IDH | CK2 |  | MON>BUS |
| 3 | Reset 'Recognized' Flag | 0 | 0 | 3 | 3 | INT>BUS |
| 4 | Module Version Query | IDL | IDH | 4 | CK1 | INT>BUS |
|  | Response | SFW | HDW | CK2 |  | MON>BUS |
| 5 | Request for VLG, TMP | IDL | IDH | 5 | CK1 | INT>BUS |
|  | Response | VLG | TMP | CK2 |  | MON>BUS |
| 6 | Request for VLO, VHI | IDL | IDH | 6 | CK1 | INT>BUS |
|  | Response | VLO | VHI | CK2 |  | MON>BUS |
| 7 | Request for TLO, THI | IDL | IDH | 7 | CK1 | INT>BUS |
|  | Response | TLO | THI | CK2 |  | MON>BUS |
| 8 | Reset VLO, VHI | IDL | IDH | 8 | CK1 | INT>BUS |
|  | Address Response | IDL | IDH | CK2 |  | MON>BUS |
| 9 | Reset TLO, THI | IDL | IDH | 9 | CK1 | INT>BUS |
|  | Address Response | IDL | IDH | CK2 |  | MON>BUS |
| 10 | Request for VTL, TVH | IDL | IDH | 10 | CK1 | INT>BUS |
|  | Response | VTL | TVH | CK2 |  | MON>BUS |
| 11 | Reset VTL, TVH | IDL | IDH | 11 | CK1 | INT>BUS |
|  | Address Response | IDL | IDH | CK2 |  | MON>BUS |
| 12 | Request for STA, TMR | IDL | IDH | 12 | CK1 | INT>BUS |
|  | Response | STA | TMR | CK2 |  | MON>BUS |
| 13 | Blink | IDL | IDH | 13 | CK1 | INT>BUS |
|  | Address Response | IDL | IDH | CK2 |  | MON>BUS |
| 14 | Clear Bypass Command | 0 | 0 | 14 | 14 | INT>BUS |
| 52-99 | Bypass Timer Command | IDL | IDH | BPT | CK1 | INT>BUS |
|  | Address Response | IDL | IDH | CK2 |  | MON>BUS |
| 100-255 | Bypass Voltage Command | IDL | IDH | BCV | CK1 | INT>BUS |
|  | Address Response | IDL | IDH | CK2 |  | MON>BUS |

DISTRIBUTED MANAGEMENT APPARATUS FOR BATTERY PACK

TECHNICAL FIELD OF THE INVENTION

This invention is concerned with the charge management of battery packs.

BACKGROUND OF THE INVENTION

High voltage battery packs comprise a plurality of lower voltage batteries connected in series. The operation of such battery packs is most efficient, and the chance of battery degradation is the smallest, when the charge state of all individual batteries is maintained in a balanced condition. During battery pack charging, for example, individual batteries may reach their maximum charge state at different times. Cessation of battery pack charging when the first battery reaches maximum charge will leave other batteries, and thus the battery pack, less than optimally charged; while continued battery pack charging to achieve maximum charge in all batteries may cause overcharging and degradation of the first batteries to reach maximum charge.

The prior art recognizes that efficient charge management of battery packs requires at least some degree of control over the charging of individual batteries within the pack. One form of such control provides a bypass circuit for each of the individual batteries which activates a current bypass path when the battery voltage equals a predetermined maximum value in order to prevent overcharge. In these circuits, however, each bypass circuit acts independently of the others; and coordinated overall battery pack charge strategies are impossible. Another form of such control provides a central control module, which may include a microcomputer, with inputs from individual battery voltage measuring circuits and outputs controlling individual battery bypass circuits. The central control, perhaps with inputs from additional sensors, may be programmed to control the bypass circuits in a more sophisticated, coordinated strategy. However, almost all the sophistication and intelligence of such systems is concentrated in the central control, with the voltage sensing and bypass circuits of individual batteries being merely extensions of the central control. Although intelligent, such systems require an expensive controller which is programmed to manage every detail of the operation of every component of the system.

SUMMARY OF THE INVENTION

This invention is a distributed management apparatus for a battery pack in which a battery monitoring module for each individual battery comprises a microcomputer and apparatus for bi-directional communication with a central control. Each microcomputer is provided with memory and its own control program, which allow sophisticated data gathering, communication and bypass control functions to be performed by each battery monitoring module independently of the central control, although still at its command, for more efficient control design and more flexible and capable system operation. In a preferred embodiment, each battery monitoring module may further comprise voltage and temperature measuring circuits with inputs to the microcomputer and a bypass circuit incorporating the microcomputer itself. All the battery monitoring modules are linked with an interface module by a minimal element, common digital communication circuit for bi-directional communication between each of the battery monitoring modules and the central control. Each battery monitoring module may provide bypass activation alternatively, as commanded by the central control, in a timer mode, in which the bypass path is activated for a commanded time, or a voltage mode, in which the bypass path is activated when the battery voltage equals a commanded value.

Further details and advantages of the invention will be apparent from the accompanying drawings and following description of a preferred embodiment.

DESCRIPTION OF A PREFERRED EMBODIMENT

Figure 1:
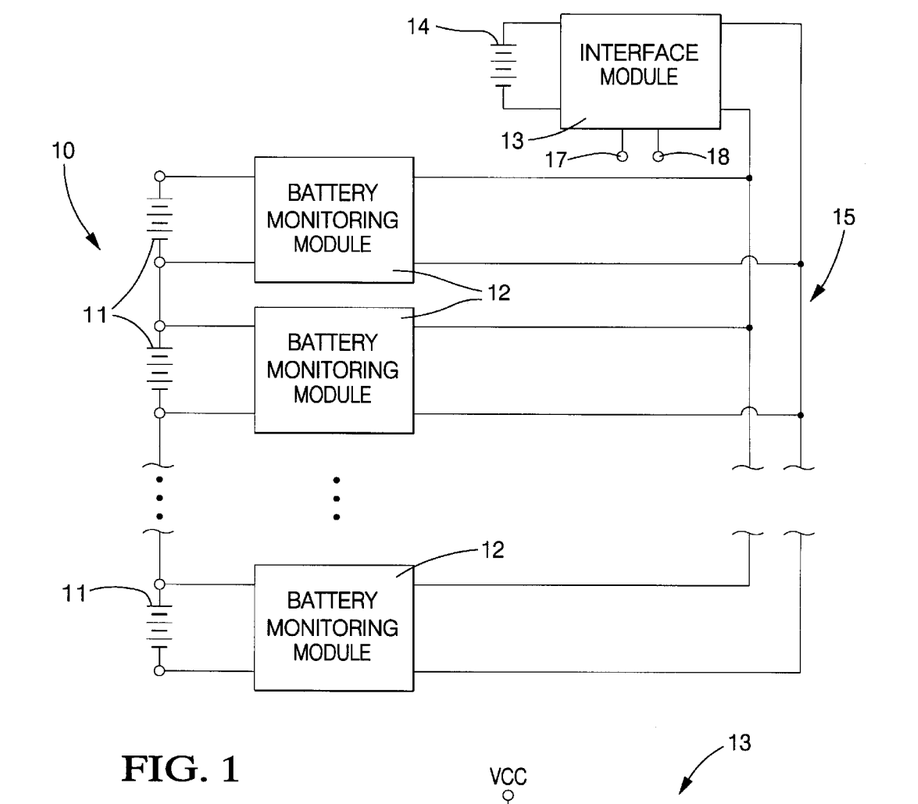
FIG. 1 shows a battery pack with a battery pack management apparatus according to this invention.

Referring to FIG. 1, a battery pack 10 comprises a plurality of batteries 11 connected in series. A battery monitoring module 12 is connected cross each battery 11. In addition, an interface module 13, powered by a separate DC power supply represented by battery 14, has a pair of terminals connected to the two lines of a common data bus 15; and each battery monitoring module 12 has a pair of terminals also connected to data bus 15 for bi-directional communication with interface module 13. Interface module 13 may comprise the central control for battery monitoring modules 12 or it may serve as an interface between battery monitoring modules 12 and a separate central control, not shown. In the latter case, interface module 13 may have separate means for communication to external apparatus such as a control and/or a display, as symbolized by terminals 17 and 18. Interface control 13 is provided with a separate electric DC power supply 14.

Each of battery monitoring modules 12 is provided with electronic circuitry, including a microcomputer, for monitoring the voltage and temperature of its associated battery 11, processing the sensed values as required, and communicating this information, when commanded, to interface module 13. In addition, each of battery monitoring modules 12 is provided with a bypass circuit effective, when commanded by interface module 13, to allow a controlled, battery voltage balancing current flow from the positive terminal of the associated battery 11 externally to the negative terminal thereof. Interface module 13 includes a microcomputer for providing overall system control: interrogating battery monitoring modules 12 to monitor the voltages and temperatures of individual batteries 11 and ordering individual battery monitoring modules 12 to activate or deactivate their current bypass circuits.

Figure 2:
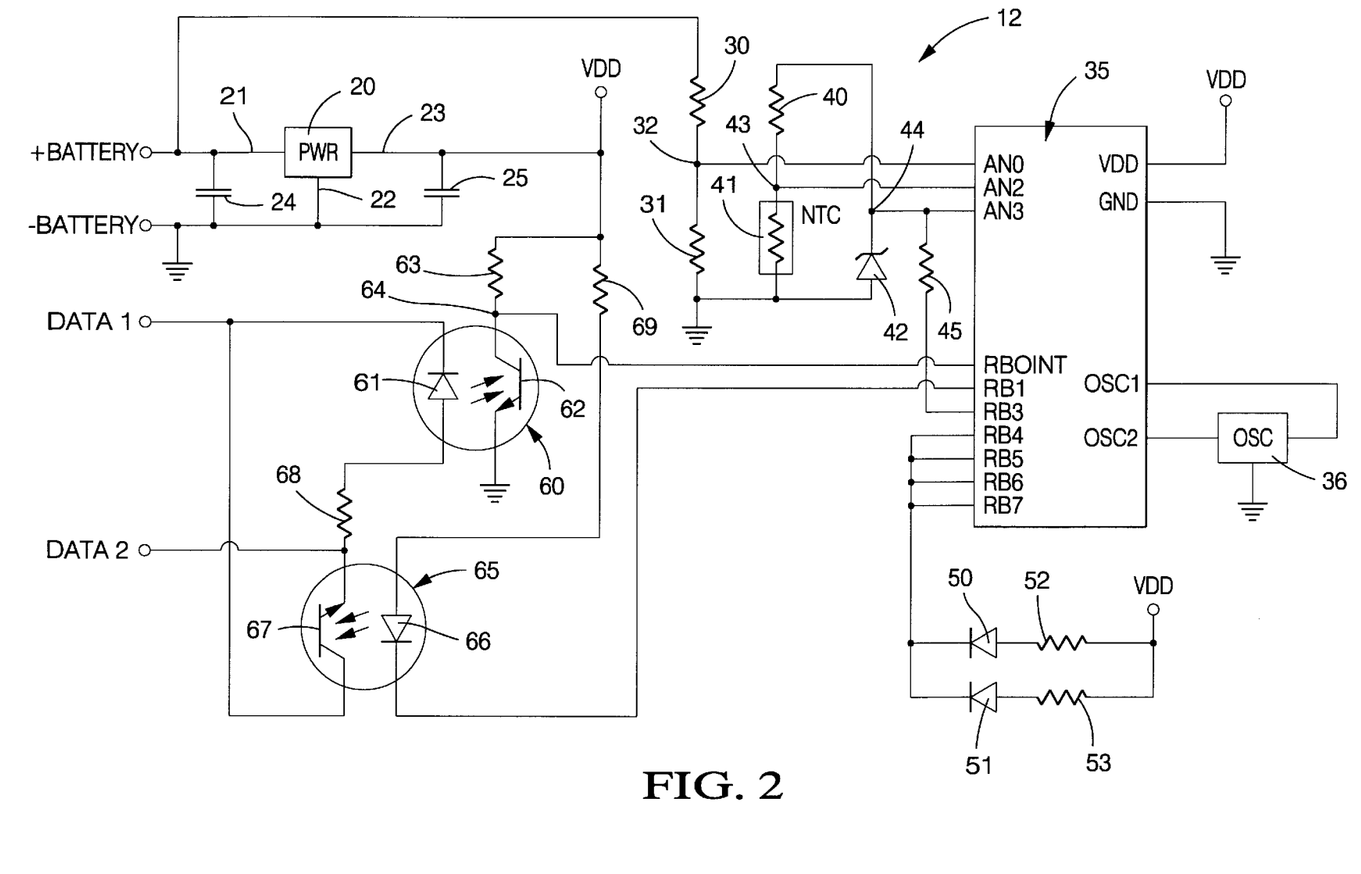
FIG. 2 is a circuit diagram of a battery monitoring module for use in the battery pack of FIG. 1.

FIG. 2 shows a typical battery monitoring module 12. Terminals +BATTERY and −BATTERY are connected to the positive and negative terminals of an associated battery 11. Terminal −BATTERY provides a ground reference for module 12, while terminal +BATTERY provides a DC voltage signal to module 12 which is equal to the voltage of associated battery 11. A power supply circuit 20 in module 12 is connected by an input terminal 21 and a ground terminal 22 across terminals +BATTERY and −BATTERY; and an output terminal 23 of power supply circuit 20, along with ground terminal 22, provides a regulated DC voltage VDD, typically 5 volts, for the internal operation of module 12. Filter capacitor 24 (1 $\mu$FD), connected across terminals 21 and 22, and filter capacitor 25 (1 $\mu$FD), connected across terminals 23 and 22, assist power supply circuit 20 in achieving its voltage regulating function.

Series connected resistors 30 (36.1K, 0.1%) and 31 (12.1K, 0.1%) connected from terminal +BATTERY to module ground (−BATTERY) form a voltage divider effectively connected across associated battery 11. Junction 32 of resistors 30 and 31 provides a voltage proportional to the voltage of associated battery 11. A microcomputer 35 has an analog input terminal AN0 connected to junction 32; and the proportionality constant of the voltage divider keeps the output thereof within a range suitable for input to microcomputer 35. Analog input terminal AN0 is one of several such software controlled analog input terminals for receiving an analog input signal to microcomputer 35 and providing it to an internal A/D converter. Thus, microcomputer 35 is able to monitor the voltage of associated battery 11. Microcomputer 35 further includes registers and on-board RAM for storing sampled values of the voltage and ROM for storing a program for controlling the sampling and storing process, as well as others. Microcomputer 35 is powered by voltage VDD provided across terminals VDD and GND and is effective to generate internal clock timing pulses with the help of an external ceramic resonator (OSC) 36 communicating through terminals OSC1 and OSC2.

A pair of resistors 40 (47.5K) and 41 form a voltage divider across a zener diode 42 (4.1V). Resistor 41 is a negative temperature coefficient (NTC) resistor having a resistance which varies downward with increasing temperature from a maximum 100K. Junction 43 of resistors 40 and 41 is connected to analog input terminal AN2 of microcomputer 35; and the other terminal of NTC resistor 41, as well as the anode of zener diode 42, are connected to module ground. Junction 44 of resistor 40 and the cathode of zener diode 42 is connected to analog input terminal AN3 of microcomputer 35 and is further connected through a resistor 45 (5.1K) to a digital terminal RB3 of microcomputer 35. Digital terminal RB3 is one of several similarly labeled digital output terminals which are capable of being selectively switched by microcomputer 35 under software control between a first, high voltage state in which the terminal is connected internally through terminal VDD to voltage VDD and a second, low voltage state, in which the terminal is connected internally through terminal GND to module ground.

NTC resistor 41 may be mounted on the circuit board of battery monitoring module 12 or may be packaged with battery 11 and connected by electrical lead wires or other connectors to terminals on the circuit board of module 12. Many such design alternatives are known to those skilled in the art for maximizing the sensitivity of NTC resistor 41 to the temperature of associated battery 11. With proper design, the resistance of NTC resistor 41 will vary with this temperature. The temperature can thus be sampled, under control of microcomputer 35, by activating digital terminal RB3 thereof to its high state, so as to apply voltage VDD through microcomputer 35 and from digital terminal 35 across the resistors 45, 40 and 41 in series to ground. Zener diode 42 fixes the voltage across resistors 40 and 41 to its rated voltage, which appears at junction 44 and may be monitored at analog input AN3. The voltage on junction 43 thus varies with the temperature of battery 11 and may be sampled by analog input AN2 when the voltage on digital output terminal RB3 is high. The voltage on terminal RB3 may be switched low to reduce current when the temperature is not being sampled. The temperature may be calculated from the voltages at analog inputs AN2 and AN3 according to an internally stored program based on principles well known in the art.

A bypass circuit is provided by microcomputer 35 with a pair of light emitting diodes (LEDs) 50 and 51 and 200 ohm resistors 52 and 53. The series combination of LED 50 and resistor 52 is connected in parallel with the series combination of LED 51 and resistor 53 between voltage VDD and a plurality of digital terminals—RB4, RB5, RB6, RB7—of microcomputer 35. When digital terminals RB4–RB7 are switched to their low state, they are connected internally through microcomputer 35 to the GND terminal; and the bypass circuit is thus activated to shunt current around associated battery 11 through a bypass current path from the +BATTERY terminal, through power supply chip 20 (output VDD), resistors 52 and 53, LEDs 50 and 51, and microcomputer 35 to module ground and terminal −BATTERY. When digital terminals RB4–RB7 are switched to their high states, the bypass circuit is deactivated and no bypass current path exists.

Microcomputer 35 has a pair of digital terminals RB0INT and RB1 connected for digital communication with communication bus 15 through a pair of opto-couplers 60 and 65, which electrically isolate battery monitoring module 12 from bus 15 and thus from interface module 13. Opto-coupler 60 includes a light emitting diode (LED) 61 in optical communication with an NPN photo-transistor 62. The collector of photo-transistor 62 is connected through a resistor 63 (10K) to voltage VDD to form a voltage divider, the junction 64 of which is connected to digital terminal RB0INT of microcomputer 35. The emitter of photo-transistor 62 is connected to module ground. The cathode of LED 61 is connected to a battery monitoring module communication terminal DATA1, which is connected to one line of communication bus 15; and the anode of LED 61 is connected through a current limiting resistor 68 (1K) to a similar terminal DATA2, which is connected to the other line of communication bus 15. Opto-coupler 65 includes a light emitting diode (LED) 66 in optical communication with an NPN photo-transistor 67. Photo-transistor 67 of opto-coupler 65 has an emitter connected to terminal DATA2 and a collector connected to terminal DATA1. LED 66 has an anode connected through a current limiting resistor 69 to voltage VDD and a cathode connected to digital terminal RB1 of microcomputer 35.

Figure 3:
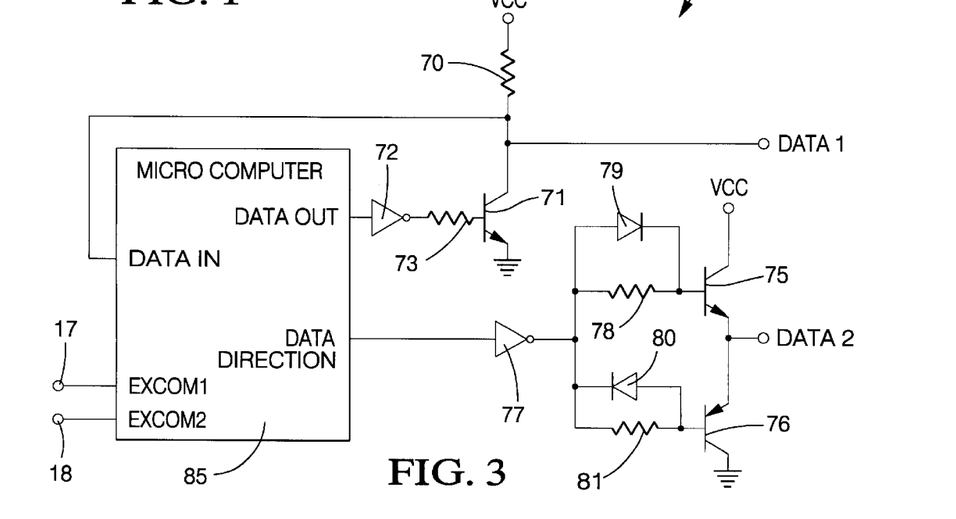
FIG. 3 is a circuit diagram of an interface module for communicating with and controlling one the battery monitoring modules in the battery pack of FIG. 1.

FIG. 3 shows interface module 13. DC power from source 14 is provided between a power terminal VCC and ground. Power terminal VCC is connected through a resistor 70 to a terminal DATA1 of interface module 13 and the collector of an NPN transistor 71 having a grounded emitter. A microcomputer 85 has a digital output terminal DATA OUT connected through an inverter 72 and resistor 73 to the base of transistor 71 and a digital input terminal DATA IN connected to terminal DATA1 of interface module 13 and thus to the collector of transistor 71. Power terminal VCC is farther connected to the collector of an NPN transistor 75 having an emitter connected to the emitter of a grounded collector PNP transistor 76. Microcomputer 85 has a digital output terminal DATA DIRECTION connected through an inverter 77 and a resistor 78 to the base of transistor 75 and further connected through the inverter 77 and a resistor 81 to the base of transistor 76. A diode 79 is connected from the output of inverter 77 to the base of transistor 75, in parallel with resistor 78; and a diode 80 is connected from the base of transistor 76 to the output of inverter 77, in parallel with resistor 81. The emitters of transistors 75 and 76 are connected to each other and a terminal DATA2. Terminals DATA1 and DATA2 of interface module 13 are connected by the lines of communication bus 15 to the similarly named terminals DATA1 and DATA2, respectively, of each battery monitoring module 12. Microcomputer 85 may further have external communication ports such as EXCOM1 and EXCOM2 connected to terminals 17 and 18, respectively, for communication to an external apparatus such as a control or display, so that interface module 13 may serve as an interface between the external device and battery monitoring modules 12.

Bi-directional digital communication between interface module 13 and each battery monitoring module 12 is provided by the apparatus described in FIGS. 1–3. To provide a message to one or more battery monitoring modules 12, microcomputer 85 of interface module 13 enters transmit mode by sending the voltage on output terminal DATA DIRECTION low, which causes a high voltage to be provided from inverter 77 to the bases of transistors 75 and 76. This turns on transistor 75 and turns off transistor 76 to provide a high voltage on terminal DATA2 and thus, through the DATA2/DATA2 line of communication bus 15, on terminal DATA2 and the anode of LED 61 in each battery monitoring module 12. Thus, LED 61 in each battery monitoring module 12 is connected to be controlled by transistor 71 of interface module 13 through the DATA1/DATA1 line of bus 15. When transistor 71 is turned on by a low DATA OUT output from microcomputer 85, terminal DATA1 is sent low and LED 61 of each battery monitoring module 12 conducts to provide light to photo-transistor 62 and thus, decrease its resistance. Since photo-transistor 62 forms a voltage divider with resistor 63 across voltage VDD, this provides a low voltage on digital terminal RB0INT of microcomputer 35 in each battery monitoring module 12. However, when a high DATA OUT output from microcomputer 85 turns transistor 71 off, terminal DATA1 is pulled high and LED 61 stops conducting. Since no light is generated, the resistance of photo-transistor 62 is increased to provide a high input on digital terminal RB0INT. Thus, microcomputer 85 of interface module 13 provides digital messages to battery monitoring modules 12 in transmit mode by holding the DATA DIRECTION output low and switching DATA OUT between high and low in a predetermined code. In transmit mode, microcomputer 85 ignores the voltage on input terminal DATA IN.

To receive a return communication from a battery monitoring module 12 after commanding a response, interface module 13 enters receive mode by providing a high DATA DIRECTION output from microcomputer 85; and this causes inverter 77 to provide a low voltage to the bases of transistors 75 and 76. This turns off transistor 75 and turns on transistor 76 to ground terminal DATA2 and thus, through the DATA2/DATA2 line of communication bus 15, the emitter of photo-transistor 67 in each battery monitoring module 12. Microcomputer 85 furthermore provides a high DATA OUT voltage to turn off transistor 71; and photo-transistor 67 of each battery monitoring module 12 is thus connected in series through the DATA1/DATA1 line of communication bus 15 with resistor 70 of interface module 13 to form a voltage divider therewith across supply voltage VCC, with terminal DATA1 of interface module 13 providing a midpoint output of the voltage divider which is connected as an input to digital terminal DATA IN of microcomputer 85. As microcomputer 35 of a battery monitoring module 12 switches conduction through LED 66 on and off, it thus causes corresponding switching of the DATA IN terminal of microcomputer 85 between high and low voltages according to the predetermined code.

Figure 4:
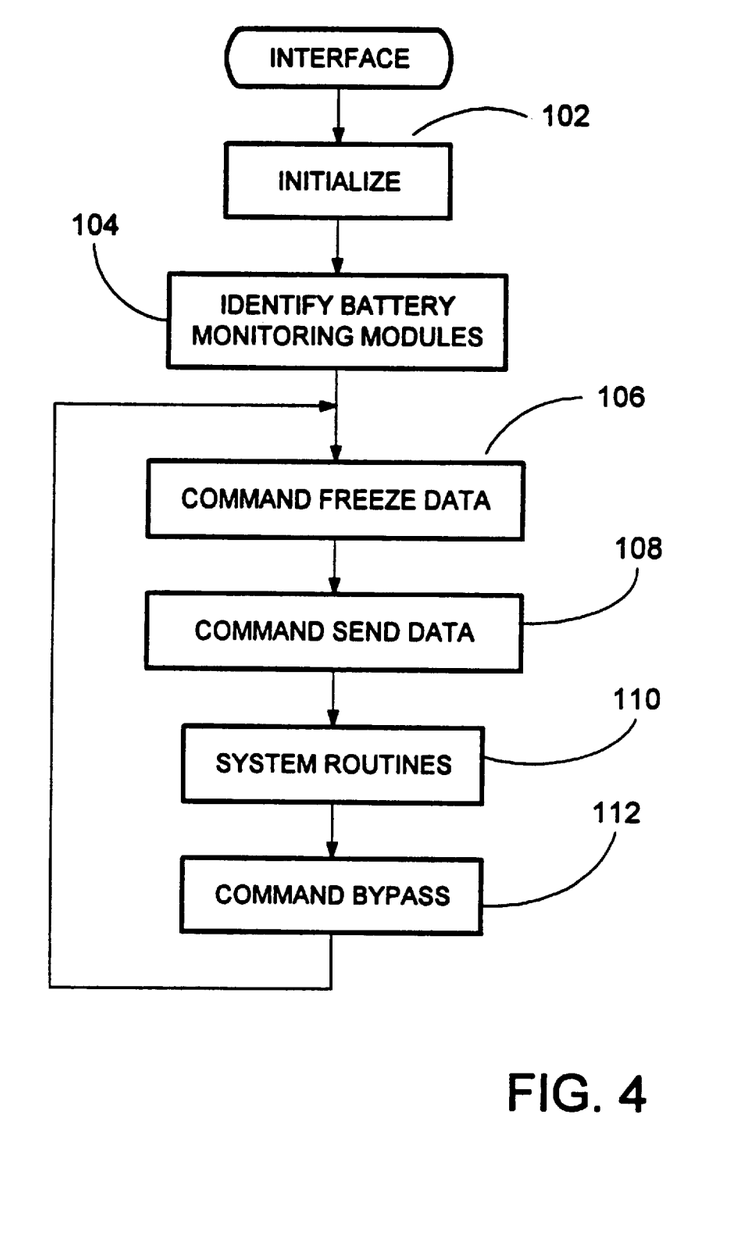
FIG. 4 is a flow chart illustrating the operation of an interface module for use with the battery pack of FIG. 1.

The operation of interface module 13 will now be described with reference to the flow chart of FIG. 4. Upon initial wake-up, microcomputer 85 of interface module 13 first runs subroutine INITIALIZE 102, in which internal registers, input ports and output ports are set up and other internal housekeeping is accomplished. The details of this depend on the particular microcomputer used and will not be further described at this point.

Microcomputer 85 next runs a subroutine IDENTIFY BATTERY MONITORING MODULES 104 wherein interface module 13 identifies all battery monitoring modules 12 connected to it on the data bus. In this subroutine, microcomputer 85 sends out a targeted initialization query to every possible two byte address from 0001h to FFFFh, with a short wait for response between consecutive queries. Each battery monitoring module 12 responds to this query sent to its address by sending its address back on communication bus 15; and microcomputer 85 stores each such address in memory as it is received.

Once all battery monitoring modules have been identified by interface module 13, microcomputer 85 may enter its main loop, during which it executes subroutine COMMAND FREEZE DATA 106. In this subroutine, it sends out a Freeze Data Command, which is not targeted to any specific one of battery monitoring modules 12 but carries a general address 0000h which is responded to by all such modules connected to communication bus 15. The purpose of this command is to cause all battery monitoring modules 12 to simultaneously set aside the latest recorded values of the voltage and temperature of the associated batteries 11, along with any derivative parameters thereof, and store the data recorded until a command is received to send the data to interface module 13. In this way, interface module 13 may receive a "snapshot" of all batteries 11 in battery pack 10 at a single moment in time.

Next, microcomputer 85 of interface module 13 runs subroutine COMMAND SEND DATA 108, in which each battery monitoring module 12 for which an address is stored is issued one or more commands to send stored data to interface module 13. A number of different commands are possible, depending on what data is required by the interface module BATTERY MONITOR programs. In a basic apparatus, each battery monitoring module 12 will be commanded to send the voltage (VLG) and temperature (TMP) values for the corresponding battery 11. In other systems, the BATTERY MONITOR programs may require one or more of the following derivative parameters of the basic voltage or temperature values: the lowest measured voltage (VLO) or temperature (TLO), the highest measured voltage (VHI) or temperature (THI), the lowest measured voltage at which TLO occurred (VTL), or the highest measured temperature at which VHI occurred (TVH). In addition, microcomputer 85 may have the additional capability to command one or more of these "highest" or "lowest" derivative parameters to be reset in any particular battery monitoring module 12. Additional data required of a responding battery monitoring module might include the status of its bypass circuit (STA), the amount of time (TMR) remaining for its bypass circuit to be activated, or its hardware and software version numbers. After any of these commands requiring data to be sent, microcomputer 85 in interface module 13 waits to receive the data before proceeding with the next command to this or the next battery monitoring module 12.

When all required data has been commanded and received, microcomputer 85 runs SYSTEM ROUTINES 110 which use this data to determine the need for battery balancing and select the battery monitoring modules 12 and mode of operation for activation of bypass circuits. These routines are not the subject of this patent application and will thus not be described in detail.

Next, microcomputer 85 in interface module 13 runs the subroutine COMMAND BYPASS 112, in which selected battery monitoring modules 12 are sent commands regarding the activation of their bypass circuits. Each battery monitoring module 12 is programmed for two different bypass control modes; and interface module 13 commands each module 12 which mode to use, gives the module 12 a relevant control parameter, and then allows the module 12 to proceed under its own local control. A first bypass control mode is based on time: microcomputer 85 commands a battery monitoring module to activate its bypass circuit for a specified time period, which may be expressed as a specified number of ½ hour time periods up to 24 hours total. A second bypass control mode is based on battery voltage: microcomputer 85 commands a battery monitoring module 12 to activate its bypass circuit whenever the voltage of its corresponding battery 11 exceeds a specified voltage. In either case, the battery monitoring module proceeds to carry out the commanded control method under its own control, by timing and counting the specified number of time periods in the first mode or by monitoring battery voltage in the second mode.

The operation of battery monitoring module 12 will now be described with reference to the flow chart of the BATTERY MONITOR program in FIG. 5 and the circuit diagram of FIG. 2. Microcomputer 35 of battery monitoring module 12 has a low power sleep mode and is responsive to a low voltage input of a predetermined duration on port RB0INT to wake up and become fully active. Thus, activity on bus 15 causes microcomputer 35 to wake-up from its sleep mode and perform whatever wake-up duties are required in subroutine WAKE-UP 120 before advancing to the main loop of its program.

In its main loop, the BATTERY MONITOR program first checks, at decision point 121, to see if the bypass circuit is activated in the timer control mode and a bypass timer has not timed out. The bypass timer is a software timer which can be set to a predetermined number TMR of time periods, such as ½ hour. When it contains a non-zero number, it is decremented at the proper times, by a timer interrupt routine triggered by a real time clock in microcomputer 35. Immediately following wake-up, the bypass circuit is in a deactivated state and the bypass timer is timed out (TMR=0). Therefore, the program then determines, at decision point 128, whether an activity timeout has occurred, as will be more fully explained at a later point in this description. Immediately following wakeup, the answer will be no. The program thus proceeds to determine, at decision point 122, if there is new activity on bus 15. Immediately following wake-up, the answer is yes, since it was new activity on bus 15 that caused the wake-up. Thus the program next determines, at decision point 123, whether the activity on bus 15 comprises a valid message to which it must respond. Each of battery monitoring modules 12 responds to either of two addresses: its own unique address and address 0000h, to which all battery monitoring modules 12 respond. If the address is either of these, the battery monitoring module 12 performs the command included in the message in subroutine PERFORM COMMAND 124.

Figure 7:
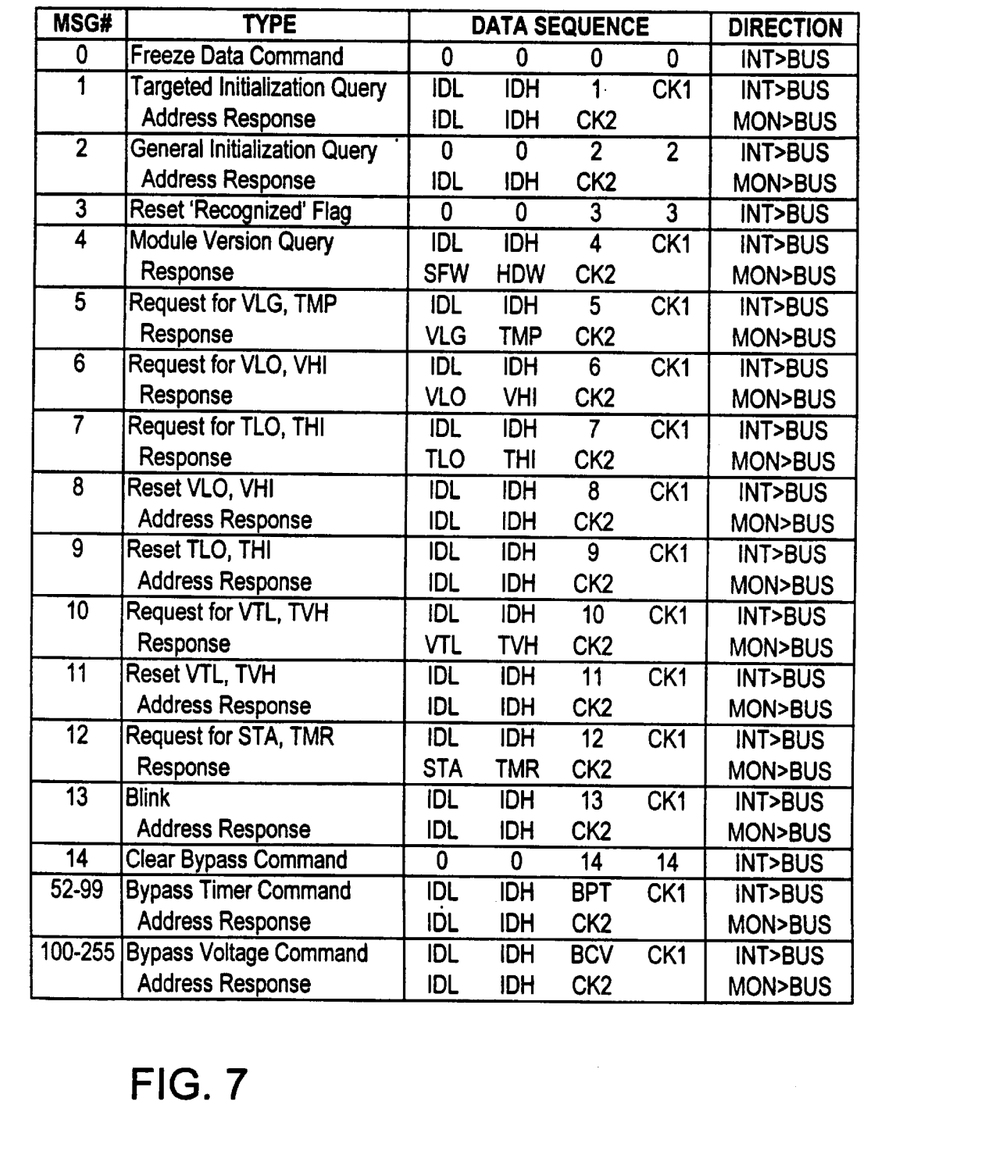
FIG. 7 is a table illustrating communications between an interface module and one or more battery monitoring modules in the battery pack of FIG. 1.

A sample of typical messages and commands is shown in the table of FIG. 7 to illustrate the capabilities of the apparatus. Messages 0, 2, 3 and 14 are general messages sent to all battery monitoring modules 12. Thus the first two bytes of the data sequence of these messages, IDL and IDH, provide the general address 0000h. The third and fourth bytes of the data sequence for these messages each provide the message number. All other messages are directed to a specific battery monitoring module; and the address is provided in the first two bytes of the data sequence, low byte (IDL) first. The third byte of these other messages gives the message number; and the fourth byte provides a check sum CK1 to help determine the validity of the message. In messages 52–255, the third byte message number also conveys data to the battery monitoring module, as will be explained in more detail below. All messages except 0, 3 and 14 require a message in response from the addressed battery monitoring module. If data is requested, the first two bytes of the response comprise the requested data; and if no data is requested, the first two bytes of the response comprise the address of the battery monitoring module as a confirmation. The third byte of the response is a check sum CK2.

Message 0 (Freeze Data Command) causes all battery monitoring modules to set aside their latest measured voltage and temperature values for later transmission to interface module 13. This ensures that interface module 13 will receive a "snapshot" of data from all battery monitoring modules taken at essentially the same time, even though the data is communicated to interface module 13 from one battery monitoring module at a time.

Message 1 (Targeted Initialization Query) causes a battery monitoring module on the bus having the indicated address to respond by returning its address to interface module 13. In this way interface module 13 identifies the battery monitoring module as being on the bus.

Message 2 (General Initialization Query) causes any battery monitoring module which has not yet been recognized by interface module 13 to return its address. This response is controlled by a 'Recognized' flag in the battery monitoring module software which is set whenever the battery monitoring module is specifically addressed by interface module 13 and which subsequently prevents a response to the General Initialization Query until it is reset. Message 3 (Reset 'Recognized' Flag) causes each battery monitoring module on the bus to reset its 'Recognized' flag.

Message 4 (Module Version Query) causes the addressed battery monitoring module to return its software version number SFW, followed by its hardware version number HDW. This allows interface module 13 to be programmed to work with battery monitoring modules having different hardware and software configurations on the same bus.

Message 5 (Request for VLG, TMP) causes the addressed battery monitoring module to return the frozen voltage value VLG, which is represented on a scale of 0–255, and temperature value TMP, which is the measured temperature in Celsius plus 40.

Message 6 (Request for VLO, VHI) causes the addressed battery monitoring module to return the stored values of the lowest (VLO) and highest VHI) voltages that it has recorded. As will be explained below, each battery monitoring module may measure voltage and temperature at times other than when it is specifically asked for such data; and it is thus programmed to store the highest and lowest values it records, in case they are required by interface module 13.

Message 7 (Request for TLO, THI) likewise causes the addressed battery monitoring module to return the stored values of the lowest (TLO) and highest (THI) temperature it has recorded.

Message 10 (Request for VTL, TVH) causes the addressed battery monitoring module to return the stored values of the lowest measured voltage (VTL) at which a TLO occurs and the highest measured temperature (TVH) at which a VHI occurs.

Message 8 (Reset VLO, VHI), message 9 (Reset TLO, THI) and message 11 (Reset VTH, TVH) each cause the addressed battery monitoring module to clear the named parameters and then return its address for confirmation.

Message 12 (Request for STA, TMR) causes the addressed bakery monitoring module to return two bytes indicating the status of the bypass circuit. The first byte is zero if the bypass circuit is deactivated and 1 if it is activated. The second indicates the number of ½ hour periods of timed bypass remaining. If the second byte is zero and the first is one, the bypass circuit is activated in the voltage mode, with the measured battery voltage greater than that transmitted in the most recent Bypass Voltage Command.

Message 13 (Blink) causes the addressed battery monitoring module to activate its bypass circuit for approximately one second if it is not already activated.

Message 14 (Clear Bypass Command) causes all battery monitoring modules on the bus to deactivate their bypass circuits.

Each of messages 52–99 (Bypass Timer Command) causes the addressed battery monitoring module to activate its bypass circuit in the timer mode for a specified number of ½ hour periods up to 24 hours, with the specified number of ½ hour periods equal to the message number minus 51. To this end, in the PERFORM COMMAND subroutine, a new message 52–99 causes the battery monitoring module to reset its bypass timer value TMR to the newly specified number before returning its own address as confirmation. In addition, the stored value of BCV is set to 100 to end any existing voltage control mode, as described below. With a non-zero value of TMR and a BCV value of 100, the battery monitoring module is in timer control mode for bypass activation; and the value of TMR indicates the remaining bypass activation time.

Each of messages 100–255, Bypass Voltage Command, causes the addressed battery monitoring module to enter the voltage mode of bypass circuit control. Actually, this command doubles as a bypass deactivation command for a single battery monitoring monitor. When the third byte of this command, BCV, equals 100 the stored value of TMR is cleared to zero to end timer control mode; and the BCV value of 100 is stored to end voltage control mode. However, when the newly commanded value equals 101–255, the newly stored BCV is read as a reference voltage so that the battery monitoring module activates its bypass circuit whenever measured voltage of the associated battery 11 exceeds a voltage specified by the value BCV.

Figure 5:
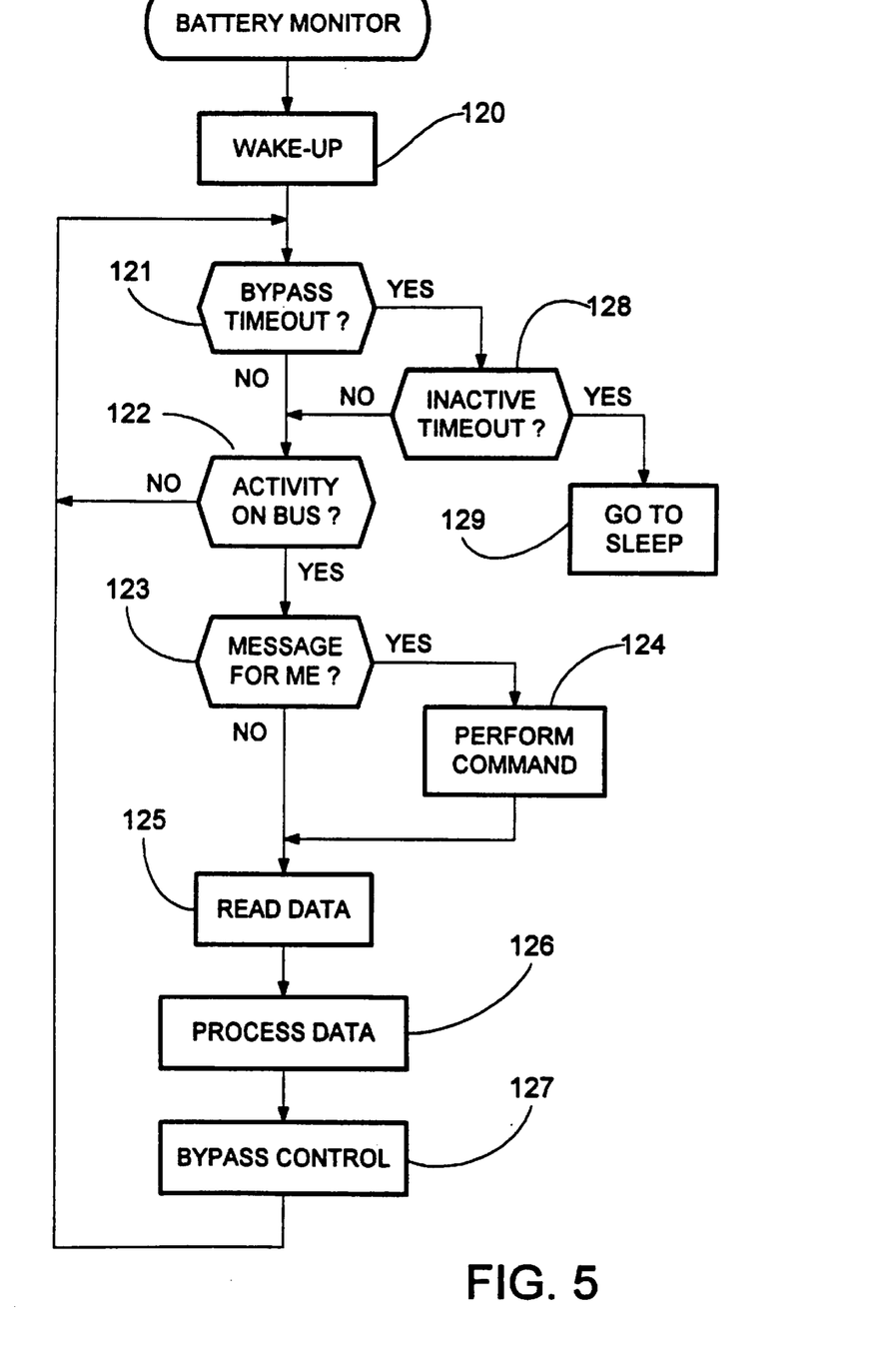
FIGS. 5 and 6 are flow charts illustrating the operation of a battery monitoring module for use in the battery pack of FIG. 1.

Returning to the flow chart of FIG. 5, the program next reads the voltage and temperature of battery 11 in subroutine READ DATA 125 after performing the command in subroutine 124. Likewise, it reads the voltage and temperature if no message was received by this battery monitoring module, as determined at decision point 123, as long as there was activity on bus 15, as determined at decision point 122. The voltage of battery 11 may be read directly on analog input AN0. The temperature is read by activating the temperature measuring circuit through port RB3 and reading the voltages on analog inputs AN2, which is the voltage drop across NTC resistor 41. Microcomputer 35 may also read the voltage on analog input AN3, which is the total voltage drop across the resister 40/resistor 41 voltage divider, for use in scaling the digital conversion process.

Figure 6:
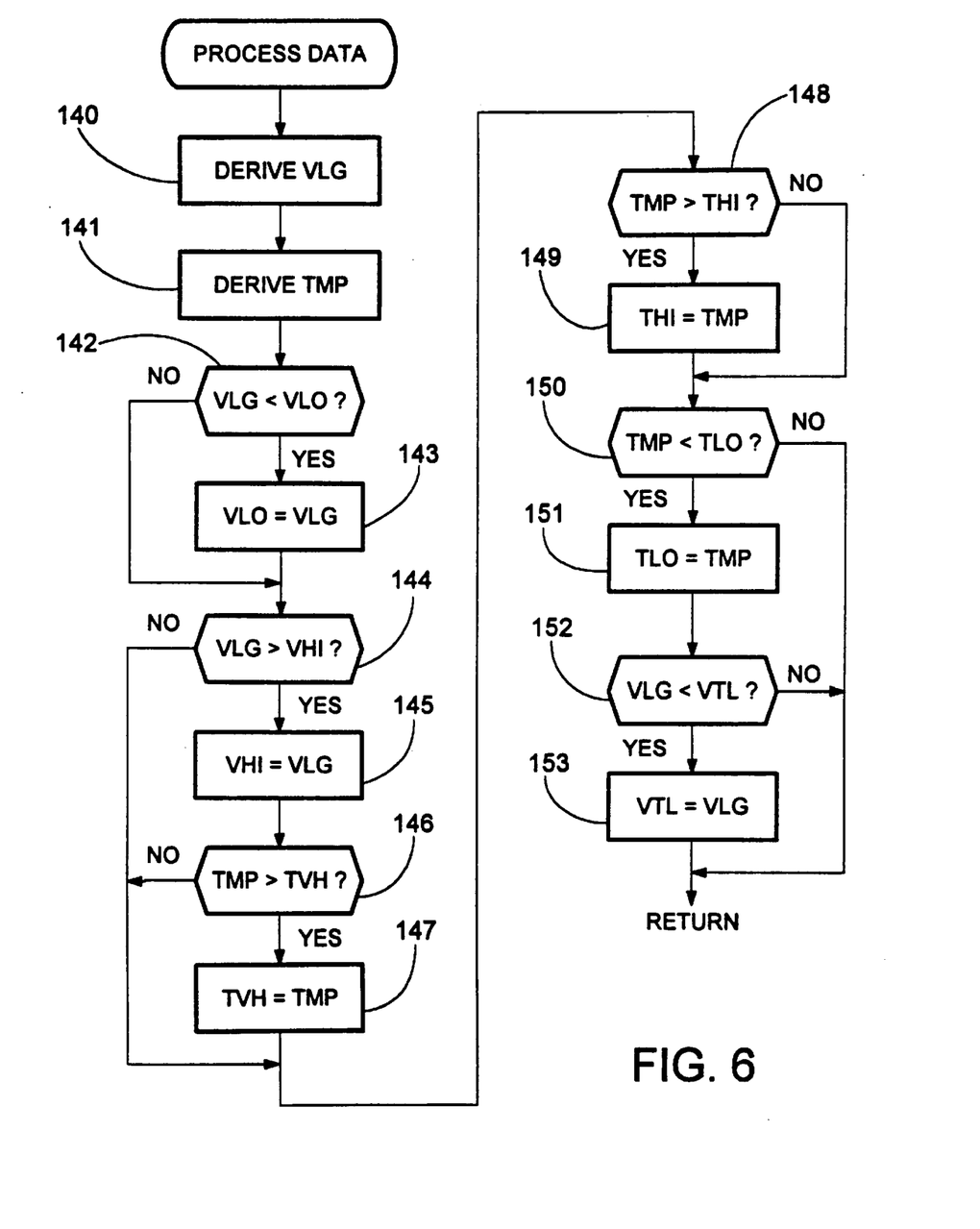

Next, in subroutine PROCESS DATA 126, microcomputer 35 processes the voltages read in subroutine READ DATA 125 to determine and store the battery voltage VLG and temperature TMP values. Subroutine PROCESS DATA is shown in greater detail in FIG. 6. The voltage VLG is derived by digitally converting the raw voltage read on analog input AN0 to a representative value from 0–255, as indicated in step 140 of FIG. 6. The temperature TMP is determined by digitally converting the raw voltage read on analog input AN2 to a digital value (using the voltage read on analog input AN3 as a scaling factor) and performing a table lookup on the digital value in step 141. At this time, these values are also processed to determine and store the other parameters derived therefrom. Referring to FIG. 6, the new value of VLG is compared with VLO at decision point 142 and, if smaller, replaces VLO in step 143. Similarly, VLG is compared with VHI at decision point 144 and, if greater, replaces VHI in step 145. If VLG replaces VHI, the new value of TMP is compared with TVH at decision point 146 and, if greater, replaces TVH in step 147. The new value of TMP is compared with THI at decision point 148 and, if greater, replaces THI in step 149. TMP is compared with TLO at decision point 150 and, if smaller, replaces TLO in step 151. If TMP replaces TLO, VLG is compared with VTI at decision point 152 and, if smaller, replaces VTL in step 153.

After the voltage and temperature data has been processed in task 126 of FIG. 5, the bypass circuit is serviced in subroutine BYPASS CONTROL 127. In this subroutine, microcomputer 35 checks the values of TMR and BCV to determine the commanded bypass status and controls the state of the bypass circuit accordingly. With a TMR value of zero and a BCV value of 100, microcomputer 35 deactivates the bypass circuit. With a non-zero value of TMR and a BCV value of 100, microcomputer 35 activates the bypass circuit if it is not already activated. With a zero value of TMR and a BCV value of 101–255, microcomputer 35 compares the voltage VLG of battery 11 with the stored value BCV, activates the bypass circuit it VLG is greater and otherwise deactivates the bypass circuit.

When subroutine BYPASS CONTROL is completed, the program loops back to decision point 121 and again checks the bypass timer value TMR. If the value of TMR is non-zero, the program proceeds to decision point 122 as previously described. Thus, as long as the bypass circuit is activated in timer control mode, the program continues to loop. If the value of TMR is zero at decision point 121, however, the program checks an activity timer in decision point 128. The activity timer is incremented independently of this program by an interrupt routine triggered by a real time clock in microcomputer 35. If the activity timer indicates that there has been activity on bus 15 within a predetermined previous time period, such as 5 seconds, the program proceeds to determine, at decision point 122, if there has been new activity on bus 15. If there has, the activity timer is cleared and the program follows the path already described, to determine if the activity comprises a command to which the program must respond. If not, the program loops back to decision point 121.

When the inactivity timer is found, in task 128, to have timed out, the microcomputer 35 proceeds to go to sleep in task 129 after deactivating the bypass circuit, if the latter is activated, and performing such other tasks as are required in preparation for sleep mode. It should be noted, however, that task 128, which can lead to sleep mode, is never entered while the value of TMR is non-zero. In other words, while the bypass circuit of module 12 is activated in timer mode, the BATTERY MONITOR program will not allow the battery monitoring module to go to sleep, even if all activity on communication bus 15 ceases, until the timer mode is ended. Once in sleep mode, microcomputer 35 remains in sleep mode until awakened by activity on bus 15.

We claim:

1. In a distributed management apparatus for a battery pack comprising a plurality of batteries connected in series, the apparatus comprising an interface module and a plurality of battery monitoring modules, one of the battery monitoring modules being associated with each of the batteries and connected thereacross by module terminals, each of the battery monitoring modules comprising, in combination, a power conditioning circuit connected across the module terminals for providing a regulated operating voltage within the battery module, sensor means responsive to a parameter of the associated battery for generating a battery parameter signal, a battery bypass circuit effective, when activated, to shunt charge around the associated battery, a microcomputer powered by the regulated operating voltage, the microcomputer comprising a CPU, memory, input apparatus for receiving the battery parameter signal, input and output apparatus for providing series connection in the battery bypass circuit and a stored program providing microcomputer control of reception and storage of the battery parameter signal and activation of the battery bypass circuit, the microcomputer being linked with the interface module by a digital communication circuit for receiving commands from the interface module and sending data thereto, the improvement comprising:

the microcomputer further comprising a pair of bypass terminals connectable within and under control of the microcomputer; and the battery bypass circuit comprising the microcomputer with the pair of bypass terminals connected in series with a current limiting resistance and the module terminals to provide a battery bypass current path through the microcomputer and current limiting resistance in series when the bypass terminals are connected within the microcomputer.

2. The distributed management apparatus of claim 1 in which the battery bypass circuit comprises an LED activated by current through the current limiting resistance.

3. The distributed management apparatus of claim 1 in which one of the pair of bypass terminals is connected to one of the module terminals and the other of the pair of bypass terminals is one of a plurality of microcomputer terminals, all of which are connectable within and under control of the microcomputer to the one of the bypass terminals and are connected externally of the microcomputer in parallel with each other and in series with the current limiting resistance, the plurality of microcomputer terminals being connected to and disconnected from the one of the bypass terminals simultaneously.

4. The distributed management apparatus of claim 1 in which the sensor means is responsive to the voltage of the associated battery and the microcomputer is responsive through the common digital communication circuit to a communicated voltage activation command signal to store a commanded voltage portion of the voltage activation command signal in the memory and connect and disconnect the bypass terminals within the microcomputer in a voltage control mode in response to the stored commanded voltage portion and the sensor means.

5. The distributed management apparatus of claim 1 in which the microcomputer further comprises a timer and is responsive through the common digital communication circuit to a communicated timed activation command signal to store a commanded time portion of the timed activation command signal in the memory and connect and disconnect the bypass terminals within the microcomputer in a timer control mode in response to the stored commanded time portion and the timer.

6. The distributed management apparatus of claim 5 in which the sensor means is responsive to the voltage of the associated battery and the microcomputer is further responsive through the common digital communication circuit to a communicated voltage activation command signal to store a commanded voltage portion of the timed activation command signal in the memory, terminate an existing timer control mode, and connect and disconnect the bypass terminals within the microcomputer in a voltage control mode in response to the stored commanded voltage portion and the sensor means.

* * * * *